United States Patent
Mayer et al.

(10) Patent No.: US 6,562,410 B1
(45) Date of Patent: May 13, 2003

(54) HEAT CURABLE EPOXY COMPOSITIONS

(75) Inventors: Carl Walter Mayer, Riehen (CH); Ramaswami Sreenivasan, Mumbai (IN); Kikkeri Divakar, Mumbai (IN)

(73) Assignee: Vantico Inc., Brewster, NY (US)

( * ) Notice: Subject to any disclaimer, the term of this patent is extended or adjusted under 35 U.S.C. 154(b) by 0 days.

(21) Appl. No.: 09/743,378

(22) PCT Filed: Jul. 2, 1999

(86) PCT No.: PCT/EP99/04603

§ 371 (c)(1),
(2), (4) Date: Jan. 8, 2001

(87) PCT Pub. No.: WO00/04075

PCT Pub. Date: Jan. 27, 2000

(30) Foreign Application Priority Data

Jul. 15, 1998 (ID) ..................................... 2041/DEL/98
Jul. 22, 1998 (EP) ............................................ 98810706

(51) Int. Cl.$^7$ .................................................. B05D 3/00

(52) U.S. Cl. ........................ 427/386; 427/487; 428/413; 525/507; 528/88; 528/89; 528/92; 528/94; 528/119

(58) Field of Search .............................. 528/88, 89, 92, 528/94, 119; 525/507; 428/413; 427/487, 386

(56) References Cited

U.S. PATENT DOCUMENTS 4,393,185 A    7/1983    Berner et al.

OTHER PUBLICATIONS

Koichi Tanaka et al "A New Method for Coupling Aromatic Aldehydes and Ketones to Produce β–Glycols Using ZN–ZnCl$_2$ in Aqueous Solution and in the Solid State", J. Org. Chem, 1990, 55, pp. 2981–2983.

Büchi et al. "Zusammenhänge zwischen der chemischen KoNstitution, den physikalisch–chemischen Eigenschaften, der chemischen Reaktivität und der Wirking einiger stellungsisomerer Lokalanästhetika" (Drug Res.) 25, Nr. 1, pp. 14–24 (1975).

H. L. Haller et al. "The Chemical Composition fo Technical DDT", J. Am. Chem. Soc 1945, pp. 15091–1602.

U.S. patent application Ser. No. 08/876,550, Behm et al., filed Jun. 16, 1997.

U.S. patent application Ser. No. 08/999,803, Moser et al., filed May 20, 1997.

*Primary Examiner*—Robert Dawson
*Assistant Examiner*—Christopher M Keehan
(74) *Attorney, Agent, or Firm*—Proskauer Rose LLP

(57) ABSTRACT

Heat curable compositions comprising: (A) at least one compound which is capable of undergoing cationic polymerization; (B) at least one quaternary ammonium salt of an aromatic-N-heterocyclic cation and of a non-nucleophilic anion; (C) at least one 1,1,2,2-substituted-1,2-ethane-diol and/or a derivative thereof, and (D) optionally further additives; and wherein said component (C) is a compound of formula (I), wherein each of $R_1$, $R_2$, and $R_3$ independently of the other is unsubstituted phenyl or has one of the meanings of $R_4$; $R_4$ is substituted phenyl optionally substituted α-naphthyl or β-naphthyl, or an optionally substituted aromatic heterocyclic ring system or each of $R_1$ and $R_2$ and/or $R_3$ and $R_4$ independently of the other form a residue of formula (II), wherein each of $R_5$ and $R_6$ independently of the other is hydrogen or $(C_1-C_4)$alkyl; $R_7$ is —$(CH_2)_n$— or —S— or —O—; and n is 0, 1, 2, or 3.

20 Claims, No Drawings

HEAT CURABLE EPOXY COMPOSITIONS

The present invention refers to heat curable cationically polymerisable resin-systems comprising an improved initiator composition.

Initiator systems used for cationic polymerisation are known and often are based on latent curing agents in order to ensure sufficient storage stability. An important drawback of such initiator systems is that they often require relatively high curing temperatures in the curing process and an extended curing cycle to effect sufficient storage life. Therefore a need exists for initiating systems which provide a long shelf-life when added to the resin composition coupled with a high reactivity at relatively low curing temperatures.

The present invention refers to cationically polymerisable resin-systems comprising an improved redox initiator system. The compositions according to the present invention have a good latency and are sufficiently stable at room temperature. They further have a high reactivity at curing temperatures, a short curing time and offer a property profile suitable for e.g. casting, molding, adhesive and impregnation applications.

The cationic redox initiator system of the present invention is based on the combination of an aromatic N-heterocyclic ammonium salt with selected 1,1,2,2-substituted-1,2-ethane-diols and derivatives thereof, wherein the substituents in the 1- and 2-positions are selected aryl residues or aromatic heterocyclic ring systems as herein below defined as compounds of formula (I). The basic principle of using a combination of an aromatic N-heterocyclic ammonium salt and 1,1,2,2-tetraphenyl-1,2-ethane-diol(benzopinacol) is disclosed in EP-A-0 066 543. At elevated temperature benzopinacol forms free radicals. These radicals reduce the aromatic N-heterocyclic ammonium salt, for example N-methyl-quinolinium-hexafluorophosphate to yield free $H^+(PF_6)^-$, which initiates the cationic polymerisation.

According to the present invention, selected compounds of formula (I) as defined below are combined with known aromatic N-heterocyclic ammonium salts to form new cationic redox initiator systems. Due to the lower cleavage temperatures of the benzopinacols used in these new combinations access is given to a wider range of cure conditions, especially to lowered cure temperatures and/or increased cure speeds for the cationic polymerisation of epoxides.

The present invention is defined in the claims. It refers to heat curable compositions capable of being cured by cationic polymerisation comprising:

(A) at least one compound which is capable of undergoing cationic polymerisation;
(B) at least one quaternary ammonium salt of an aromatic-N-heterocyclic cation which contains one or two N-atoms, and of a non-nucleophilic anion;
(C) at least one 1,1,2,2-substituted-1,2-ethane-diol and/or a derivative thereof, wherein the substituents in the 1- and 2-positions are selected aryl residues or aromatic-heterocyclic ring systems; and
(D) optionally further additives;

which is characterised in that:

said component (B) is selected from the group of anions comprising $BF_4^-$, $PF_6^-$, $SbF_6^-$, $SbF_5(OH)^-$, $[B(X)_p(Y)_q]^-$, or $CF_3(CF_2)_mSO_3^-$, wherein p and q are zero or an integer from 1 to 4, and wherein the sum of p and q is always 4;

each X (for $p \geq 1$) independently of the other is halogen, preferably fluorine or chlorine, or hydroxyl, wherein for halogen p is zero, 1, 2 or 3; and for hydroxyl p is zero, 1 or 2;

each Y (for $q \geq 1$) independently of the other is phenyl, optionally substituted with at least two halogen atoms, preferably fluorine or with one or two electron attracting groups, preferably $—CF_3$, $—OCF_3$, $—NO_2$, $—CN$, or Y is an aryl residue with at least two aromatic rings, preferably naphthyl or biphenyl, optionally substituted with one or two halogen atoms, preferably fluorine, or with one or two electron attracting groups, preferably $—CF_3$, $—OCF_3$, $—NO_2$ or $—CN$; and m is zero or an integer from 1 to 17; and said component (C) is a compound of formula (I):

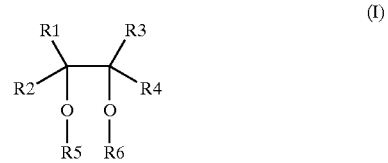

(I)

wherein
each of $R_1$, $R_2$ and $R_3$ independently of the other is unsubstituted phenyl or has one of the meanings of $R_4$;

$R_4$ is phenyl substituted by linear or branched $(C_1–C_{12})$alkyl, $(C_1–C_8)$alkoxy-$(C_1–C_8)$alkyl, $(C_1–C_{12})$alkyloxy, $(C_1–C_{12})$alkylthio, $(C_1–C_{12})$alkylcarbonyl, halogen, nitro, cyano, halo$(C_1–C_8)$alkyl, aryl, aryl-$(C_1–C_8)$alkyl; aryloxy, arylthio, benzoyloxy, benzoylmethyl and/or naphthoyloxy, or $R_4$ is α-naphthyl or β-naphthyl, 1-, 2- or 3-pyridyl, N-substituted(1-, 2- or 3-)pyridyl, α-quinolinyl, β-quinolinyl, N-substituted (α- or β-)quinolinyl, and wherein said aryl and heterocyclic rings may be further substituted by linear or branched $(C_1–C_{12})$alkyl or halogen; or each of $R_1$ and $R_2$ and/or $R_3$ and $R_4$ independently of the other form a residue of formula (II):

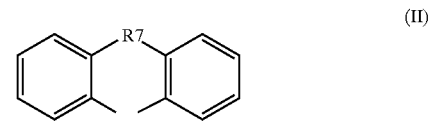

(II)

wherein
each of $R_5$ and $R_6$ independently of the other is hydrogen or $(C_1–C_4)$alkyl;
$R_7$ is $—(CH_2)_n—$ or $—S—$ or $—O—$;
n is 0, 1, 2 or 3; and
wherein the weight-ratio of component B) to component C) is from 0.05:1.0 to 1.0:0.05.

The invention also refers to a process for the thermal polymerisation of heat curable compositions capable of being cured by cationic polymerisation characterised in that said compositions are heated in the presence of an initiator combination of the components (B) and (C) as defined herein above.

The present invention further refers to novel compounds of formula (I), wherein each $R_1$ and $R_3$ independently of the other is phenyl or one of the meanings given for $R_2$ and each $R_2$ and $R_4$ independently of the other is 2-n-butylphenyl, 2-fluorophenyl or 2,6-difluorophenyl.

The invention further refers to novel N-benzyl-quinolinium salts having a N-benzyl-quinolinium cation and associated therewith a anion of the formula $CF_3(CF_2)_3SO_3^-$ or the Anion $A_4$

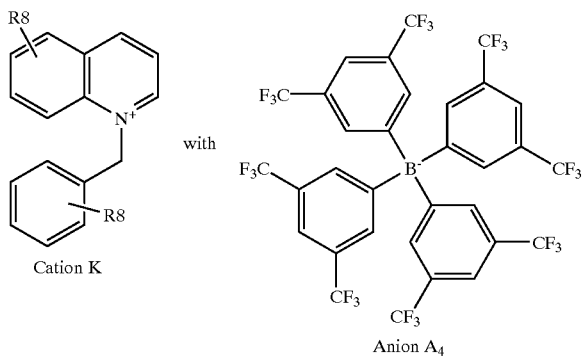

Cation K with Anion A₄ and wherein each of $R_8$ independently of the other is linear or branched $(C_1-C_{12})$alkyl, $(C_1-C_8)$alkoxy-$(C_1-C_8)$alkyl, $(C_1-C_{12})$alkyloxy, $(C_1-C_{12})$alkylcarbonyl, halogen or hydroxyl.

Compounds which are capable of undergoing cationic polymerisation are oxygen or sulphur containing saturated heterocyclic compounds, in particular those having 3, 4 or 5 ring members, and their derivatives. Examples of such compounds are compounds containing at least one epoxy group, such as ethylene oxide, propylene oxide, styrene oxide, phenyl glycidyl ether or butyl glycidyl ether; oxetanes, such as trimethylene oxide, 3,3-dimethyloxetane or 3,3-di(chloromethyl)oxetane; oxolanes such as tetrahydrofuran or 2,3-dimethyltetrahydrofuran; cyclic acetals such as trioxan, 1,3-dioxolane or 1,3,6-trioxacyclooctane; cyclic lactones such as β-propiolactone, ε-caprolactone and the alkyl derivatives thereof; thiiranes such as ethylene sulfide, 1,2-propylene sulfide or thioepichlorohydrin; and thietanes such as 1,3-propylene sulfide or 3,3-dimethylthietane.

Further polymerisable compounds of this invention are those ethylenically unsaturated compounds which are polymerisable by a cationic mechanism. Such compounds include mono- and diolefins, for example isobutylene, 1-octene, butadiene and isoprene; styrene, allylbenzene or vinylcyclohexane; vinyl ethers such as vinyl methyl ether, vinyl isobutyl ether or ethylene glycol divinyl ether; vinyl esters such as vinyl acetate or vinyl stearate; and dihydropyran derivatives, for example the 3,4-dihydro-2H-pyran-2-carboxylic acid esters of 2-hydroxymethyl-3,4-dihydro-2H-pyran.

Further polymerisable compounds of this invention are also the prepolymers of phenol-formaldehyde resins, acrylic resins, alkyd resins or polyester resins containing functional groups.

Still further polymerisable compounds of this invention are mixtures of cationically polymerisable compounds and compounds polymerisable by free radicals, for example mixtures of epoxy resins with monomeric or oligomeric acrylic or methacrylic acid esters. In this case, the polymerisation takes place by a cationic mechanism and a free radical mechanism.

Compounds of particular importance amongst these polymerisable compounds cited above are the mono-, di- and polyepoxides and epoxide resin prepolymers which are used for the preparation of epoxy resins. This is usually accomplished by chemical curing with phenols, dicarboxylic acid anhydrides and the like, either at room temperature or with heating. If the initiator combination of this invention is used, the epoxides can be thermally cured, without the addition of chemical reactants, i.e. a one-component system can be employed.

The mono-, di- and polyepoxides used for this purpose may be aliphatic, cycloaliphatic or aromatic compounds. Examples of such compounds are the glycidyl ethers of aliphatic or cycloaliphatic diols or polyols, for example those of ethylene glycol, propane-1,2-diol, propane-1,3-diol, butane-1,4-diol, diethylene glycol, glycerol, trimethylolpropane or 1,4-dimethylol-cyclohexane or of 2,2-bis-(4-hydroxycyclohexyl)-propane, and the glycidyl ethers of di- and polyphenols, for example of resorcinol, 4,4'-dihydroxydiphenylmethane, 4,4,-dihydroxydiphenyl-2,2-propane or novolacs.

Further glycidyl compounds of technical importance are the glycidyl esters of carboxylic acids, in particular of di- and polycarboxylic acids. Examples are the glycidyl esters of adipic acid, phthalic acid, tetra- or hexahydrophthalic acid, isophthalic acid or terephthalic acid or of trimellitic acid.

Examples of polyepoxides which are not glycidyl compounds are the diepoxides of vinylcyclohexene or dicyclopentadiene, glycidyl 3,4-epoxycyclohexanecarboxylate or 3',4'-epoxycyclohexylmethyl 3,4-epoxy-cyclohexanecarboxylate, butadiene diepoxide or isoprene diepoxide, epoxidised linoleic acid derivatives or epoxidised polybutadiene.

Furthermore, it is also possible to use ethylenically unsaturated epoxy compounds which are able to react polyfunctionally under the conditions of the invention and thus are capable of forming crosslinked resins. Examples of such compounds are allyl glycidyl ether, acrylic acid glycidyl ether or methacrylic acid glycidyl ether or unsaturated polyepoxides such as partially acrylated or methacrylated epoxy resins.

Preferred epoxides which may be used according to the invention are the mono-, di- and polyglycidyl ethers of mono-, di- and polyphenols, the mono-, di- and polyglycidyl ethers of aliphatic and cycloaliphatic mono- and polyols, glycidyl esters of aromatic and non-aromatic mono- and polycarboxylic acids.

The mono-, di- and polyepoxides may be used in mixtures with one another or with monoepoxides or in mixtures with hydroxy compounds, for example in order to modify the physical properties of the resins obtainable therefrom. The mono-, di- and polyepoxides can also be pre-cured by chemical means, for example by reaction with diols, or dicarboxylic acid anhydrides. The use of such prepolymers for the production of articles from epoxy resins can have certain advantages over the use of the mono-, di- and polyepoxides, for example more simple storage and handling, more rapid processing to shaped articles and also the possibility of the incorporation of additives, such as glass fibres or pigments, into the prepolymers, for example during the preparation of prepregs.

The heat curable composition according to the present invention further contains component (B), i.e. at least one quaternary ammonium salt of an aromatic-N-heterocyclic cation which contains one or two N-atoms, and of a non-nucleophilic anion selected from the group comprising $BF_4^-$, $PF_6^-$, $SbF_6^-$, $SbF_5(OH)^-$, $[B(X)_p(Y)_q]^-$, or $CF_3(CF_2)_m SO_3^-$, wherein p, q, X, Y and m have been defined herein above. Therein, the aromatic-heterocyclic compound which contains one or two N-atoms carries a positive charge and represents the cationic part of the salt which is associated with the non-nucleophilic anion.

Examples of aromatic heterocyclic nitrogen bases are, in particular, 6-membered nitrogen-containing heterocyclic compounds such as pyridine, pyrimidine, pyridazine and pyrazine, and the alkyl or aryl derivatives thereof, benzo and naphtho derivatives, e.g. picoline, lutidine, quinoline, isoquinoline, quinoxaline, phthalazine, quinazoline, acridine, phenanthridine or phenanthroline.

Particularly preferred ammonium salts suitable for use as component (B) are ammonium salts of the cations of formulae (III), (IV) and (V):

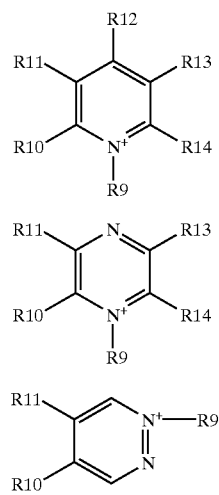

wherein $R_9$ is $(C_1-C_{12})$alkyl, aryl-$(C_1-C_8)$alkyl, $(C_3-C_{15})$ alkoxyalkyl or benzoylmethyl, each of $R_{10}$, $R_{11}$, $R_{13}$ and $R_{14}$ independently of the other is hydrogen, $(C_1-C_4)$alkyl or phenyl, or $R_{10}$ and $R_{11}$ or $R_{11}$ and $R_{12}$ or $R_{12}$ and $R_{13}$ or $R_{13}$ and $R_{14}$, together with the two carbon atoms to which they are attached, are a fused benzo, naphtho, pyridino or quinolino radical.

$R_9$ is preferably methyl, ethyl, n-propyl, iso-butyl, linear or branched butyl, preferably tert.-butyl, dodecyl, octadecyl, benzyl, diphenylmethyl, acetyl or benzoyl, preferably methyl, ethyl, butyl and benzyl.

Different basic ring systems which may be further substituted, are possible. Some of these are shown as following formulas (a) to (i), wherein A and B each time are either —CH= or a nitrogen atom:

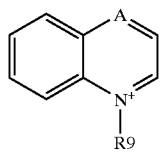

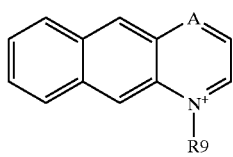

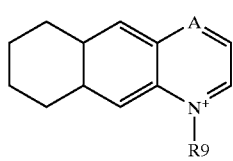

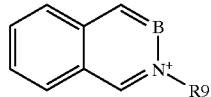

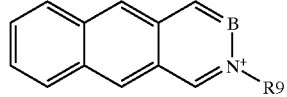

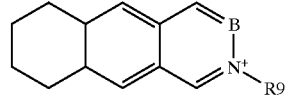

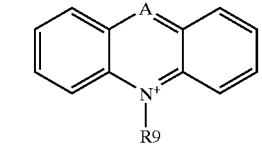

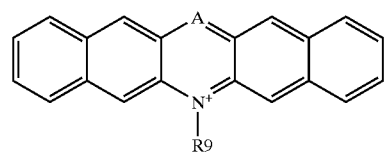

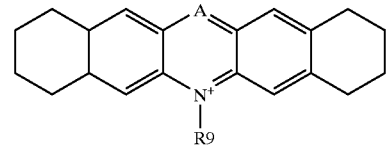

In said quaternary ammonium salt the aromatic-heterocyclic cation is associated with a non-nucleophilic anion, selected from the group consisting of $BF_4^-$, $PF_6^-$, $SbF_6^-$, $SbF_5(OH)^-$, $[B(X)_p(Y)_q]^-$, or $CF_3(CF_2)_mSO_3^-$, wherein X (for $p \geq 1$) is preferably fluorine or hydroxyl, wherein for hydroxyl p is preferably one. Each Y (for $q \geq 1$) independently of the other is preferably phenyl substituted with at least two halogen atoms, preferably fluorine or with one or two electron attracting groups, preferably —$CF_3$, —$OCF_3$ or —$NO_2$ and preferably pentafluorophenyl, 3,5-di-trifluoromethyl-phenyl, 3,5-di-nitro-phenyl, para-trifluoromethyloxy-phenyl or naphthyl or biphenyl substituted with one or two fluorine atoms or with one or two electron attracting groups, preferably —$CF_3$.

Particularly preferred compounds are $[B(X)_p(Y)_q]^-$ and preferably $B(Y)_4^-$, wherein Y is pentafluorophenyl, 3,5-di-trifluoromethyl-phenyl or para-trifluoromethyloxy-phenyl.

Some of these ammonium salts are known compounds and some are novel. The novel compounds may be prepared analogously to known methods.

Individual examples of compounds of the formulae (III), (IV) and (V) are: 1-methylquinolinium hexafluorophosphate, 1-methylquinolinium hexafluoroantimonate, 1-methylquinolinium hexafluoroarsenate, 1-methylquinolinium pentafluorohydroxyantimonate, 1-methylquinolinium tetrafluoroborate, 1,2-dimethylquinolinium hexafluorophosphate, 1-ethylquinolinium hexafluorophosphate, 1-butylquinolinium hexafluorophosphate, 1-benzoylmethylquinolinium hexafluorophosphate, 1-benzoylmethylquinolinium hexafluoroantimonate, 1-methyl-2,3-diphenylpyridinium hexafluorophosphate, 1,2-dimethyl-3-phenylpyridinium hexafluorophosphate, 1-benzoylmethylpyridinium hexafluorophosphate, 1-ethoxyethylquinolinium hexafluorophosphate, 2-methylisoquinolinium hexafluorophosphate, 10-methylacridinium hexafluorophosphate, 10-benzoylmethylacridinium hexafluorophosphate, 10-butylacridinium hexafluoroarsenate, 5-methylphenanthridinium hexafluorophosphate, 5-benzoylmethylphenanthridinium hexafluorophosphate, 1-methylnaphthyridinium hexafluorophosphate, 1-methyl-2,3-diphenylquinoxalinium hexafluorophosphate, 1,2,3-trimethylquinoxalinium hexafluorophosphate, 1-methylquinazolinium hexafluorophosphate, 1-methylquinolinium hexafluorophosphate, 1,2,4,6-tetramethylpyrimidinium hexafluorophosphate, 1-methyl-2,4-diphenylpyrimidinium hexafluorophosphate, 1-methyl-3-phenylpyridazinium hexafluorophosphate, 1-methyl-2,5-diphenylpyridazinium hexafluorophosphate, 1-methylphenanthrolinium hexafluorophosphate, 5-butylphenazinium hexafluorophosphate, 1-methylquinoxalinium hexafluorophosphate, 1-benzoylmethylquinoxalinium hexafluorophosphate. Particularly preferred compounds are N-methylquinolinium hexafluoroantimonate, N-benzylquinolinium hexafluoroantimonate, N-benzylquinolinium triflate, N-benzylquinolinium perfluorobutanesulfonate, N-benzylquinolinium tetrakis(3,5-bis-trifluoromethyl)phenyl-borate, and benzylquinolinium tetrakis(pentafluorophenyl)borate.

The composition of the present invention further comprises a compound of formula (I):

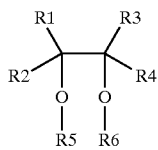

as defined herein above.

Each of $R_1$, $R_2$ and $R_3$ independently of the other is preferably phenyl or has one of the meanings of $R_4$ and preferably has one of the meanings of $R_4$.

$R_4$ is preferably phenyl substituted by linear or branched $(C_1-C_4)$alkyl, $(C_1-C_4)$alkoxy-$(C_1-C_2)$alkyl, $(C_1-C_4)$alkyloxy, $(C_1-C_4)$alkylcarbonyl, fluorine, chlorine, nitro, halomethyl, phenyl, phenyl-$(C_1-C_2)$alkyl; phenyloxy, phenylthio, benzoyloxy, benzoylmethyl and/or naphthoyloxy, or $R_4$ is α-naphthyl or β-naphthyl, 1-, 2- or 3-pyridyl, N-substituted(1-, 2- or 3-)pyridyl wherein the N-substituent has one of the meanings given for $R_9$, α-quinolinyl, β-quinolinyl, N-substituted (α- or β-)quinolinyl wherein the N-substituent has one of the meanings given for $R_9$, and wherein said aryl and heterocyclic rings may be further substituted by linear or branched $(C_1-C_4)$alkyl or fluorine or chlorine; or each of $R_1$ and $R_2$ and/or $R_3$ and $R_4$ independently of the other form a residue of formula (II):

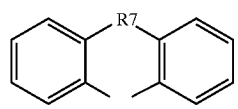

wherein
each of $R_5$ and $R_6$ independently of the other is hydrogen; and $R_7$ is —$CH_2$— or —S— or —O—.

In the definitions of all the substituents mentioned before, the alkyl groups can be straight-chain or branched. This also applies to the alkyl moiety of groups containing alkoxy, alkylthio, alkoxycarbonyl and the other groups containing alkyl. These alkyl groups preferably contain 1 to 12, more preferably 1 to 8 and, most preferably, 1 to 4, carbon atoms.

Alkyl typically includes methyl, ethyl, isopropyl, n-propyl, n-butyl, isobutyl, sec-butyl, tert-butyl as well as different isomeric pentyl, hexyl, heptyl, octyl, nonyl, decyl, undecyl and dodecyl groups.

Haloalkyl typically includes fluoromethyl, difluromethyl, triflouromethyl, chloromethyl, dichloromethyl, trichloromethyl, 2,2,2,-trifluoroethyl, 2-fluoroethyl, 2-chloroethyl, 2,2,2,trichloroethyl as well as halogenated, preferably fluorinated or chlorinated, isopropyl, n-propyl, n-butyl, isobutyl, sec-butyl and tert-butyl groups and also the different isomeric halogenated pentyl, hexyl, heptyl and octyl groups.

Arylalkyl preferably contains 7 to 12 carbon atoms and, particularly, 7 to 10 carbon atoms. Aralkyl can be, for example, benzyl, phenethyl, 3-phenylpropyl, alfa-methylbenzyl, 4-phenylbutyl and alfa,alfa-dimethylbenzyl.

Aryl preferably contains 6 to 10 carbon atoms. Aryl can be, for example, phenyl, pentalinyl, indenyl, naphthyl, azulinyl and anthryl.

Alkoxy ist typically methoxy, ethoxy, propyloxy, isopropyloxy, n-butyloxy, isobutyloxy, sec-butyloxy and tert-butyloxy, the isomers of pentyloxy, hexyloxy, heptyloxy, octyloxy, nonyloxy, decyloxy, undecyloxy and dodecyloxy.

Halogen will be understood to mean fluoro, chloro, bromo and iodo, preferably fluoro, chloro and bromo.

Alkyl-carbonyl can be, for example, methyl-, ethyl-, n-butyl-, tert-butyl-, n-pentyl-, isopentyl- and n-hexyloxy-carbonyl.

Preferred compounds of formula (I) are those wherein each of $R_1$, $R_2$ and $R_3$ independently of the other is phenyl or has one of the meanings of $R_4$ and wherein $R_4$ is phenyl substituted by methyl, ethyl, propyl or butyl, fluorine, trifluoromethyl, or $R_4$ is α-naphthyl or β-naphthyl, 1-, 2- or 3-pyridyl, α-quinolinyl or β-quinolinyl.

Most preferred compounds of formula (I) are those wherein each of $R_1$, $R_2$ and $R_3$ independently of the other is phenyl or has one of the meanings of $R_4$ and wherein $R_4$ is 2-methylphenyl, 2-ethylphenyl, 2-n-butylphenyl, 2-fluorophenyl, 2,6-difluorophenyl, α-naphthyl, β-naphthyl, 1-, 2- or 3-pyridyl, α-quinolinyl or β-quinolinyl. Particularly preferred compounds are those wherein $R_4$ is 2-methylphenyl, 2-ethylphenyl, 2-n-butylphenyl, 2-fluorophenyl and 2,6-difluorophenyl.

Preferred combinations component (B) with component (C) are benzylquinolinium-hexafluoroantimonate and 1,2-bis(2-methylphenyl)-benzopinacol, benzylquinolinium-hexafluoroantimonate and 1,2-bis(2-ethylphenyl)-benzopinacol, benzylquinolinium-hexafluoroantimonate and 1,2-bis(2-fluorophenyl)-benzopinacol, benzylquinolinium-hexafluoroantimonate and 1,2-bis(2,6-difluorophenyl)-benzopinacol and combinations of N-benzylquinolinium-triflate, N-benzylquinolinium-perfluorobutanesulfonate, N-benzylquinolinium-tetrakis(3,5-bis-trifluoromethyl)phenyl-borate, benzylquinolinium-tetrakis(pentafluorophenyl)borate with the aforementioned different benzopinacols.

Some of the compounds of formula (I) are known and some are novel. The novel compounds may be prepared analogous to known methods.

To carry out the polymerisation in practice, the monomer or monomer mixture is mixed with the necessary amount of the two initiator components, i.e. components (A) and (B). These mixtures are stable at room temperature and can be handled without hazard. In general, it is not necessary to add any additional activating component prior to initiation of polymerisation, so that the mixtures are therefore one-component systems which can be cured at any time. The polymerisation itself is effected by heating the mixture to elevated temperature. In general, temperatures of 60° C.–200° C. and in particular of 80° C.–160° C. are necessary for this purpose, depending on the material used and the polymerisation time desired. The shorter the desired polymerisation time, the higher the polymerisation temperature must be. According to the initiator compositions disclosed in the present invention it is possible to work with milder cure conditions e.g. in comparison with systems disclosed in EP-A-0 066 543, where this is desirable, for example for the treatment of temperature sensitive substrates, e.g. in paper coating, wood coating, plastics coating, or in conformal coating of printed circuit boards provided with semiconductor devices. Other uses are the encapsulation of electric coils under energy saving conditions, adhesive applications, and the construction of epoxy molded structures or of laminate structures.

Frequently, polymerisation will be carried out with simultaneous shaping, for example in hot presses or in moulds which can be supplied with a source of heat. Heating may be effected e.g. in an oven, infrared radiation or microwave radiation.

The thermally-initiated polymerisation can also be combined with a photopolymerisation. In this case, the resin initiator composition of this invention is either first subjected to irradiation with short-wave light and then heated or first heated and then irradiated. Conventional UV lamps are suitable for the irradiation, and the effect of the irradiation can be further increased by the addition of catalytic amounts of a photosensitiser. Suitable photosensitisers are e.g. organic dyes, fused aromatic hydrocarbons, for example perylene, anthracene or thioxanthone and the derivatives thereof which are known in general as sensitisers for photochemical processes. The advantage of such additional UV radiation is that, by this means, the time for heat curing can be shortened or the curing temperature can be lowered.

The required amount of the two initiator components, i.e. the quaternary ammonium salt defined as component (B) herein above and the compound of formula (I) which is defined as component (C) herein above, depends on the nature of the material to be polymerised and on the desired polymerisation conditions. In general, 0.1 to 10% by weight, preferably 0.1 to 5% by weight, of each of the two initiator components is used, based on the weight of the compound (A) to be polymerised. It is preferred to use 1 to 5% by weight, preferably 1 to 2% by weight, of the ammonium salt, and 1 to 2% by weight of the thermal radical former, i.e. the substituted benzopinacol-derivative. The weight ratio of component (B) to component (C) is preferably from 0.05:1.0 to 1.0:0.05 and most preferably from 0.5:2.0 to 2.0:0.5.

In addition to the polymerisable compounds and the initiator compositions, the mixture may also contain further additives which are customarily employed in plastics and resin technology, in amounts commonly used in the specific fields of applications considered. Examples of such additives are extender resins, fillers, pigments, dyes, glass fibres or other fibres, stabilisers such as antioxidants or light stabilisers, flame retardants, antistats, blowing agents and/or levelling agents.

These additives may be blended with the polymerisable compounds simultaneously with the initiator components, or independently of these, in any desired sequence. Depending on their consistency, the mixtures of the invention are solids or liquids or highly viscous liquids. For use as paints, a spreadable or sprayable consistency will be preferred. For use as a casting or laminating resin, a castable consistency will be preferred. For use as a moulding composition, a solid consistency will be preferred.

The end properties of the products obtained (cured) with the compositions of the present invention are as good as those of the compositions cured by conventional means and used for example for surface protection, as adhesive, as electrical insulating composition and in the production of laminates and mouldings or of foamed articles. The choice of polymerisable compounds depends on the intended use. Mixtures of cationically curable compounds may be used in order to achieve specific properties in the cured resin. These can be mixtures of compounds of the same chemical type, for example two different polyepoxides or one polyepoxide and a monoepoxide, or mixtures of compounds of different types, for example a mixture of a polyepoxide and tetrahydrofurane or caprolactone.

The following examples in which parts and percentages are by weight further illustrate the invention.

EXAMPLE 1

Synthesis of Substituted Benzopinacols

The procedure for the synthesis of substituted benzopinacols follows the benzopinacol coupling, reaction as described by Koichi Tanaka, Satoshi Kishigami and Fumio Toda in the "Journal of Organic Chemistry", 55, 2981–2983, (1990), with minor variations for some examples, which are indicated as footmarks to Table 1. The starting benzophenones were purchased from Aldrich, Fluka or Lancaster, or synthesised, based on literature procedures (see footmarks to Table 1). The reaction schema is as follows:

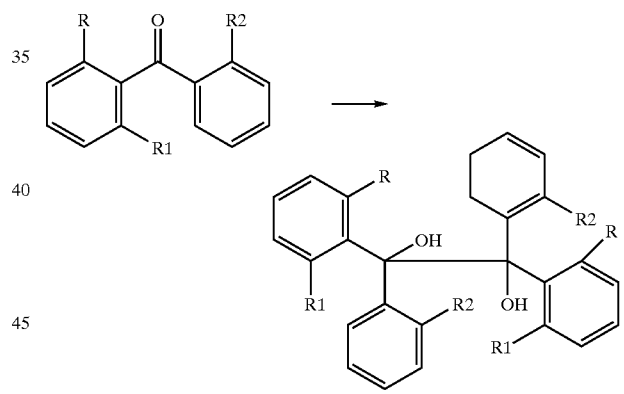

To a stirred mixture of the ortho substituted benzophenone (0.015 mol) and a mixture of tetrahydrofurane (THF)/water (50 ml, 1:1 volume/volume) was added zinc dust (10 g, 0.15 mol) and $ZnCl_2$ (2 g, 0.015 mol). The mixture was stirred and heated under nitrogen at a temperature of 45–50° C. for 6–8 hours. The reaction was monitored on TLC (Silica Gel). When all the starting material (benzophenone) has disappeared, the reaction mixture was concentrated under reduced pressure on a rotavap. The residue was diluted with water (25 ml) and filtered. The filtrate (cake)was twice washed with 1 N HCl (2×20 ml) and then with water (25 ml). Finally, the cake was extracted three times with chloroform (3×50 ml). The chloroform extract was dried over anhydrous sodium sulfate and concentrated to yield the benzopinacol. Yields and analytical results are given in Table 1. All the benzopinacols showed IR absorption at ca. 3400–3500 $cm^{-1}$, characteristic of the OH group, and absence of any peak at 1650–1700 $cm^{-1}$ as a characteristic of the keto group.

TABLE 1

| Example No. CAS No. | R | R₁ | R₂ | Yield % | ¹H NMR | m.p. °C |
|---|---|---|---|---|---|---|
| 1<br>424-79-3 | F | H | H | 75 | 6.8–7.3 (m, 16H, Ar—H) 8.05 (m, 2H, Ar—H) | 175–77 |
| 2<br>95950-06-4 | Cl | H | H | 45 | 6.72 (m, 4H, Ar—H), 7–7.35 (m, 12H, Ar—H), 8.2 (m, 2H, Ar—H) | 71–73[1] |
| 3<br>20002-32-8 | Me | H | H | 40 | 1.2 (6H, Ar—CH₃), 6.65 (m, 4H, Ar—H), 6.88–7.28 (m, 12H, Ar—H), 7.92 (m, 2H, Ar—H) | 145–47[1] |
| 4<br>52056-31-2 | OMe | H | H | 33 | 3.21 (s, 3H, OCH₃), 3.39 (s, 3H, OCH₃), 6.65–7.52 (m, 16H, Ar—H), 8.1 (m, 2H, Ar—H) | 165–67 |
| 5<br>new | F | F | H | 75 | 6.25 (m, 2H, Ar—H), 6.6–7.5 (m, 16H, Ar—H) | 130–35 |
| 6<br>Beil., III Vol. 6 p. 5940 | Et | H | H | 20 | 0.8 (t, 6H, —CH₂CH₃ ), 2.2–2.6 (m, 4H, —CH₂CH₃), 6.62 (m, 4H, Ar—H), 6.8–7.0 (m, 2H, Ar—H), 7.0–7.4 (m, 12H, Ar—H), 7.9–8.0 (m, 2H, Ar—H) | 133–37[2, 4, 5] |
| 7<br>new | n-Bu | H | H | 30 | 0.68 (t, 6H, —CH₃), 0.8–1.6 (m, 8H, —CH₂CH₂—), 2.2–2.5 (m, 4H, Ar—CH₂), 6.58–6.65 (m, 4H, Ar—H), 6.8–7.0 (m, 2H, Ar—H), 7.0–7.4 (m, 10H, Ar—H), 7.9–8.0 (m, 2H, Ar—H) | 128–30[3, 4, 6] |

Footnotes
CAS No = Chemical Abstract Number
[1]In case of examples 2 and 3 the compounds were purified by column chromatography over silica gel, elution being done with hexane/ethyl acetate (1:1; vol:vol). No purification was done in any of the other cases.
[2]The starting material for example 5 was prepared as per J. Am. Chem. Soc., p. 1601, (1945).
[3]2-n-Butyl benzophenone (starting material for example 8) was prepared as per the method in Arzn. Forschung, 25, p. 14 (1975)
[4]In case of examples 7 and 8, CuCl₂ (2 g., 0.015 mol.) was added in addition to Zn and ZnCl₂ while carrying out the coupling reaction.
[5]In case of example 7 the work up procedure was modified. The cake was extracted with methanol. The methanol extract was concentrated on a rotavap under 20 mm vacuum to get a gummy material which on trituration with hexane afforded a solid. This was collected by filtration and dried.
[6]For example 8, the heating period was extended to 30 hours and after the usual work up the cake was extracted with ethyl acetate. Concentration of the ethyl acetate extract gave the required benzopinacol.

EXAMPLE 2 a) Synthesis of N-benzyl-quinolinium Salts, General Method of Preparation

The synthesis of the N-benzylquinolinium salts referred to in this invention is performed by procedures known to the art, i.e. quarternization of quinoline by benzylbromide, followed by the exchange of the bromide anion by the anion of interest. Anions $A_1$–$A_4$ are commercially available from different sources (e.g. Fluka). The following N-benzyl-quinolinium salts have been investigated:

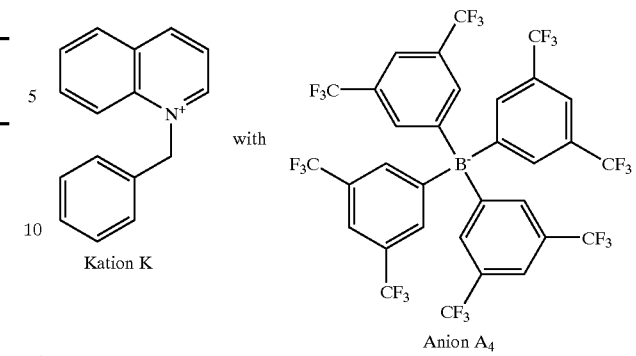

and cation K with $SbF_6^-$ (Anion $A_1$), CAS No. 142860-23-9
cation K with $CF_3SO_3^-$ (Anion $A_2$), CAS No. 190078-47-8
cation K with $CF_3(CF_2)_3SO_3^-$ (Anion $A_3$), new compound
cation K with Anion $A_4$, new compound b) Effect of Substituents on the Polymerisation Temperature of Epoxides—Monitoring Procedure for Measuring the Effect of Benzopinacol Substituents on the Cationic Epoxy Cure Temperatures To about 8 gr. of epoxy compound, 0.5%-mole/epoxy equivalent of the N-benzylquinolinium salt and 1.0%-mole/epoxy. equivalent of the corresponding benzopinacol were added. The mixture was stirred with a magnetic stirrer at a temperature of 40° C. until all the components added were completely dissolved. Samples of 5–10 mg were weighed into an aluminium crucible and analysed with a DSC (differential. scanning calorimetry) apparatus (Mettler DSC 12E). Measurement conditions were at 10° C./min temperature increase between room temperature and 300° C. Shift of cure temperature is defined as ° C. shift of maximum heat flow $\delta H_{max}$ of the sample measured with respect to $\delta H_{max}$ of a standard sample composed of the corresponding epoxide and the initiating system N-benzylquinolinium hexafluoroantimonate/parent benzopinacol.

The effects obtained with these systems in combination with the epoxides A and/or B are shown in Table 2 and Table 3.

TABLE 2

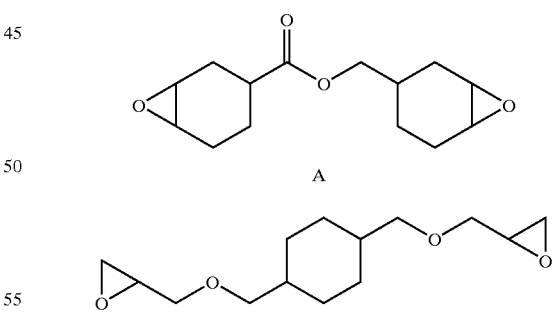

Benzopinacols/N-benzylquinolinium-$SbF_6$ Initiated Cure of epoxides A and B

| Initiator Composition | Shift of "Cure" Temperature *1 ($\delta H_{max}$ DSC) in A | Shift of "Cure" Temperature *1 ($\delta H_{max}$ DSC) in B |
|---|---|---|
| Standard<br>N-Benzyl-quinolinium $SbF_6$/<br>Benzopinacol | 0° C. | 0° C. |

TABLE 2-continued

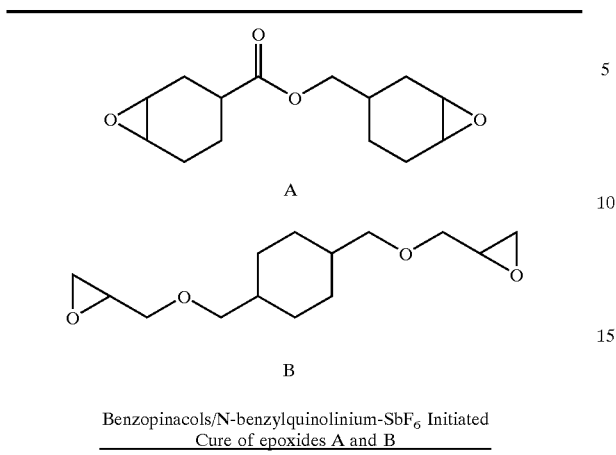

Benzopinacols/N-benzylquinolinium-SbF$_6$ Initiated Cure of epoxides A and B

| Initiator Composition | Shift of "Cure" Temperature *1 (δH$_{max}$ DSC) in A | Shift of "Cure" Temperature *1 (δH$_{max}$ DSC) in B |
|---|---|---|
| N-Benzyl-quinolinium SbF$_6$/ Table 1, No. 3 | ≈ −20° C. | ≈ −20° C. |
| N-Benzyl-quinolinium SbF$_6$/ Table 1, No. 5 | ≈ −40 to −45° C. | ≈ −35 to −40° C. |
| N-Benzyl-quinolinium SbF$_6$/ Table 1, No. 6 | ≈ −40° C. | ≈ −30° C. |
| N-Benzyl-quinolinium SbF$_6$/ Table 1, No. 7 | ≈ −30° C. | ≈ −30° C. |

*1 = as compared to initiation of epoxide A and B by respective standard

TABLE 3

Influence of various N-benzylquinolinium Salt/Benzopinacol initiator mixtures on epoxide A estimated "Cure Conditions" as compared to N-benzylquinolinium SbF$_6$/benzopinacol SbF$_6$ standard (δH$_{max}$ in DSC)

| | SbF$_6^-$ | CF$_3$SO$_3^-$ | CF$_3$(CF$_2$)$_3$SO$_3^-$ | Anion A$_4$ |
|---|---|---|---|---|
| parent Benzopinacol | ± 0° C. (standard) | ≈ + 25° C. | ≈ + 20° C. | 0 to + 5° C. |
| Table 1, No. 3 (Dimethyl) | ≈ − 20° C. | ≈ + 10–15° C. | ≈ + 3° C. | ≈ − 20° C. |
| Table 1, No. 5 (Tetrafluor) | ≈ −40 to −45° C. | not measured | ≈ − 5° C. | not measured |
| Table 1, No. 6 (Diethyl) | ≈ − 40°C. | ≈ + 10–15° C. | ≈ ± 0° C. | ≈ − 30° C. |
| Table 1, No. 7 (Dibutyl) | ≈ − 20° C. | ≈ + 10–15°C. | ≈ ± 0° C. | ≈ − 25° C. |

What is claimed is:

1. Heat curable compositions capable of being cured by cationic polymerisation comprising:
(A) at least one compound which is capable of undergoing cationic polymerisation;
(B) at least one quaternary ammonium salt of an aromatic-N-heterocyclic cation which contains one or two N-atoms, and of a non-nucleophilic anion;
(C) at least one 1,1,2,2-substituted-1,2-ethane-diol and/or a derivative thereof, wherein the substituents in the 1- and 2-positions are selected aryl residues or aromatic-heterocyclic ring systems; and
(D) optionally further additives;
characterised in that:
said component (B) is selected from the group of anions comprising BF$_4^-$, PF$_6^-$, SbF$_6^-$, SbF$_5$(OH)$^-$, [B(X)$_p$(Y)$_q$]$^-$, or CF$_3$(CF$_2$)$_m$SO$_3^-$, wherein
p and q are zero or an integer from 1 to 4, and wherein the sum of p and q is always 4;
each X (for p≧1) independently of the other is halogen, or hydroxyl, wherein for halogen p is zero, 1, 2 or 3; and for hydroxyl p is zero, 1 or 2;
each Y (for q≧1) independently of the other is phenyl, optionally substituted with at least two halogen atoms, or with one or two electron attracting groups, or Y is an aryl residue with at least two aromatic rings, optionally substituted with one or two halogen atoms, or with one or two electron attracting groups, and m is zero or an integer from 1 to 17; and
said component (C) is a compound of formula (I):

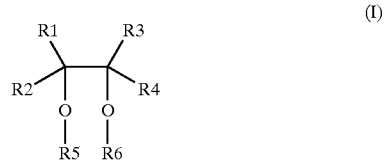

wherein
each of R$_1$, R$_2$ and R$_3$ independently of the other is unsubstituted phenyl or has one of the meanings of R$_4$;
R$_4$ is phenyl substituted by linear or branched (C$_1$–C$_{12}$)alkyl, (C$_1$–C$_8$)alkoxy-(C$_1$–C$_8$)alkyl, (C$_1$–C$_{12}$)alkyloxy, (C$_1$–C$_{12}$)alkylthio, (C$_1$–C$_{12}$) alkylcarbonyl, halogen, nitro, cyano, halo(C$_1$–C$_8$) alkyl, aryl, aryl-(C$_1$–C$_8$)alkyl; aryloxy, arylthio, benzoyloxy, benzoylmethyl and/or naphthoyloxy, or R$_4$ is α-naphthyl or β-naphthyl, 1-, 2- or 3-pyridyl, N-substituted(1-, 2- or 3-)pyridyl, α-quinolinyl, β-quinolinyl, N-substituted (α- or β-)quinolinyl, and wherein said aryl and heterocyclic rings may be further substituted by linear or branched (C$_1$–C$_{12}$)alkyl or halogen; or
each of R$_1$ and R$_2$ and/or R$_3$ and R$_4$ independently of the other form a residue of formula (II):

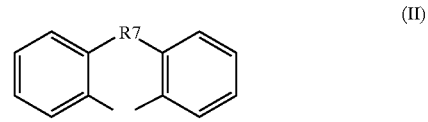

wherein
each of R$_5$ and R$_6$ independently of the other is hydrogen or (C$_1$–C$_4$)alkyl;
R$_7$ is —(CH$_2$)$_n$— or —S— or —O—;
n is 0, 1, 2 or 3; and
wherein the weight-ratio of component B) to component C) is from 0.05:1.0 to 1.0:0.05.

2. Composition according to claim 1, wherein component (A) is an oxygen or a sulphur containing saturated heterocyclic compound, having 3, 4 or 5 ring members, or a derivative thereof.

3. Composition according to claim 1, wherein component (A) is a compound containing at least one epoxy group.

4. Composition according to claim 1, wherein component (A) is selected from mono-, di- and polyepoxides and epoxide resin prepolymers which are used for the preparation of epoxy resins.

5. Composition according to claim 1, wherein component (A) is selected from mono- and diolefins, vinyl ethers, vinyl esters, dihydropyran derivatives, prepolymers of phenol-formaldehyde resins, acrylic resins, alkyd resins and/or polyester resins containing functional groups.

6. Composition according to claim 1, wherein component (A) is selected from mixtures of cationically polymerisable compounds and compounds polymerisable by free radicals.

7. Composition according to claim 1, wherein the aromatic-heterocyclic compound of component (B) which carries a positive charge is selected from pyridine, pyrimidine, pyridazine and pyrazine, and the alkyl or aryl derivatives thereof, from benzo and naphtho derivatives, preferably from picoline, lutidine, qinoline, isoquinoline, quinoxaline, phthalazine, quinazoline, acridine, phenanthridine and/or phenanthroline.

8. Composition according to claim 7, wherein the aromatic-heterocyclic compound of component (B) is a cation of formulae (III), (IV) and (V):

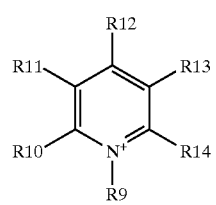
(III)

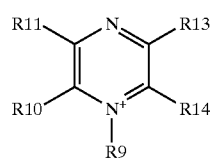
(IV)

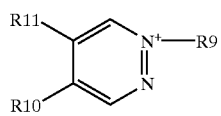
(V)

wherein
$R_9$ is $(C_1–C_{12})$alkyl, aryl-$(C_1–C_8)$alkyl, $(C_3–C_{15})$ alkoxyalkyl or benzoylmethyl,
each of $R_{10}$, $R_{11}$, $R_{13}$ and $R_{14}$ independently of the other is hydrogen, $(C_1–C_4)$alkyl or phenyl, or $R_{10}$ and $R_{11}$ or $R_{11}$ and $R_{12}$ or $R_{12}$ and $R_{13}$ or $R_{13}$ and $R_{14}$, together with the two carbon atoms to which they are attached, are a fused benzo, naphtho, pyridino or quinolino radical.

9. Composition according to claim 8, wherein $R_9$ is methyl, ethyl, n-propyl, iso-butyl, linear or branched butyl, dodecyl, octadecyl, benzyl, diphenylmethyl, acetyl or benzoyl.

10. Composition according to claim 8, wherein the aromatic-heterocyclic compound of component (B) is a cation of one of the formulas (a) to (i), wherein A and B each time are either —CH= or a nitrogen atom:

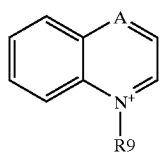
(a)

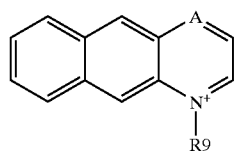
(b)

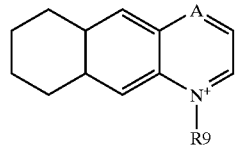
(c)

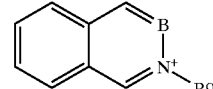
(d)

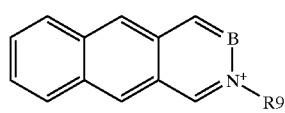
(e)

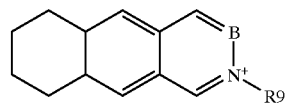
(f)

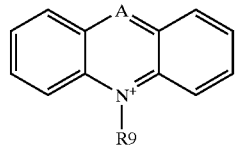
(g)

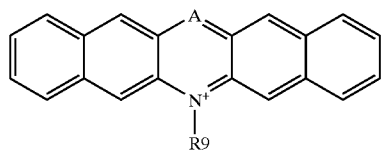
(h)

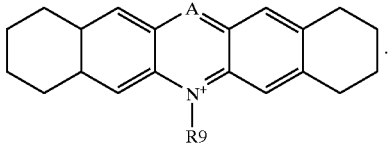
(i)

11. Composition according to claim 1, wherein the non-nucleophilic anion of component (B) is selected from the group consisting of $BF_4^-$, $PF_6^-$, $SbF_6^-$, $SbF_5(OH)^-$, $[B(X)_p(Y)_q]^-$, or $CF_3(CF_2)_mSO_3^-$ wherein X (for $p \geq 1$) is fluorine or hydroxyl, wherein for hydroxyl p is one and each Y (for $q \geq 1$) independently of the other is phenyl substituted with at least two halogen atoms, or with one or two electron attracting groups, selected from —$CF_3$, —$OCF_3$ or —$NO_2$ or naphthyl or biphenyl substituted with one or two fluorine atoms or with one or two electron attracting groups.

12. Composition according to claim 1, wherein the substituent Y in the non-nucleophilic anion of component (B) is pentafluorophenyl, 3,5-di-trifluoromethyl-phenyl or paratrifluoromethyloxy-phenyl.

13. Composition according to claim 1, wherein $R_4$ is phenyl substituted by linear or branched $(C_1–C_4)$alkyl, $(C_1–C_4)$alkoxy-$(C_1–C_2)$alkyl, $(C_1–C_4)$alkyloxy, $(C_1–C_4)$ alkylcarbonyl, fluorine, chlorine, nitro, halomethyl, phenyl, phenyl-$(C_1–C_2)$alkyl; phenyloxy, phenylthio, benzoyloxy, benzoylmethyl and/or naphthoyloxy, or $R_4$ is α-naphthyl or β-naphthyl, 1-, 2- or 3-pyridyl, N-substituted (1-, 2- or 3-)pyridyl wherein the N-substituent has one of the meanings given for $R_9$, α-quinolinyl, β-quinolinyl, N-substituted (α- or β-)quinolinyl wherein the N-substituent has one of the meanings given for $R_9$, and wherein said aryl and heterocyclic rings may be further substituted by linear or branched $(C_1–C_4)$alkyl or fluorine or chlorine; or each of $R_1$ and $R_2$ and/or $R_3$ and $R_4$ independently of the other form a residue of formula (II), wherein each of $R_5$ and $R_6$ independently of the other is hydrogen; and $R_7$ is —$CH_2$— or —S— or —O—.

14. Composition according to claim 13, wherein $R_4$ is phenyl substituted by methyl, ethyl, propyl or butyl, fluorine, trifluoromethyl, or $R_4$ is α-naphthyl or β-naphthyl, 1-, 2- or 3-pyridyl, α-quinolinyl or β-quinolinyl.

15. Composition according to claim 13, wherein $R_4$ is 2-methylphenyl, 2-ethylphenyl, 2-butylphenyl, 2-fluorophenyl, 2,6-difluorophenyl, α-naphthyl, β-naphthyl, 1-, 2- or 3-pyridyl, α-quinolinyl or β-quinolinyl, preferably 2-methylphenyl, 2-ethylphenyl, 2-butylphenyl, 2-fluorophenyl and 2,6-difluorophenyl.

16. Composition according to claim 1, wherein the combination of component (B) with component (C) is benzylquinolinium-hexafluoroantimonate and 1,2-bis(2-methylphenyl)-benzopinacol, benzylquinolinium-hexafluoroantimonate and 1,2-bis(2-ethylphenyl)-benzopinacol, benzylquinolinium-hexafluoroantimonate and 1,2-bis(2-fluorophenyl)-benzopinacol, benzylquinolinium-hexafluoroantimonate and 1,2-bis(2,6-difluorophenyl)-benzopinacol, or combinations of N-benzylquinolinium-triflate, N-benzylquinolinium-perfluorobutanesulfonate, N-benzylquinolinium-tetrakis(3,5-bis-tri-fluoromethyl)phenyl-borate, and/or benzylquinolinium-tetrakis(pentafluorophenyl)borate with the aforementioned benzopinacols.

17. Composition according to claim 1, wherein component (D) is selected from extender resins, fillers, pigments, dyes, glass fibres and/or other fibres, stabilisers, preferably antioxidants or light stabilisers, flame retardants, antistats, blowing agents, levelling agents, and/or heat stabilizers.

18. A method for paper coating, wood coating, plastics coating, conformal coating of printed circuit boards provided with semiconductor devices, encapsulation of electric coils, adhesive applications, or construction of epoxy molded structures and/or of laminate structures comprising the step of applying a composition according to claim 1 to a surface.

19. A method according to claim 18 further comprising simultaneous shaping with a source of heat, infrared radiation or microwave radiation optionally in combination with photopolymerisation.

20. Process for the thermal polymerisation of a composition according to claim 1, characterised in that said composition is heated in the presence of an initiator combination of the components (B) and (C).

* * * * *